United States Patent [19]
Flint

[11] 3,948,564
[45] Apr. 6, 1976

[54] FLUID BEARING APPARATUS AND METHOD UTILIZING SELECTIVE TURNTABLE DIVERTER STRUCTURE

[75] Inventor: Alan G. Flint, San Jose, Calif.

[73] Assignee: GCA Corporation, Bedford, Mass.

[22] Filed: May 19, 1975

[21] Appl. No.: 578,550

Related U.S. Application Data

[63] Continuation of Ser. No. 434,018, Jan. 17, 1974, abandoned.

[52] U.S. Cl................ 302/31; 193/31 R; 198/31 R; 302/2 R
[51] Int. Cl.² ...................................... B65G 51/00
[58] Field of Search....... 302/2 R, 29, 31; 193/31 R, 193/31 A, 36, 39; 198/25, 31 R, 81

[56] References Cited
UNITED STATES PATENTS

| | | | |
|---|---|---|---|
| 3,567,002 | 3/1971 | Russ..................... | 198/25 |
| 3,645,581 | 2/1972 | Lasch et al............. | 302/2 R |
| 3,718,371 | 2/1973 | Lasch..................... | 302/31 |
| 3,730,595 | 5/1973 | Yakubowski............. | 302/2 R |

Primary Examiner—Evon C. Blunk
Assistant Examiner—Jeffrey V. Nase
Attorney, Agent, or Firm—Flehr, Hohbach, Test, Albritton & Herbert

[57] ABSTRACT

Apparatus and method for handling articles, such as silicon and like wafers used in producing electronic devices. Articles are transferred between two predetermined stations on a fluid bearing track structure and may be selectively diverted in sequence into a storage magazine which defines a buffer station so that articles to be handled or treated in adjacent associated apparatus may be maintained in readily available supply to satisfy the needs of the associated apparatus. When such needs may be satisfied by direct transfer of articles into the associated apparatus the storage buffer zone is bypassed. A selectively actuated fluid bearing turntable directs articles into or from the storage magazine as operating conditions require. All handling of articles is automatically effected on fluid bearings and requires no direct manual participation.

23 Claims, 9 Drawing Figures

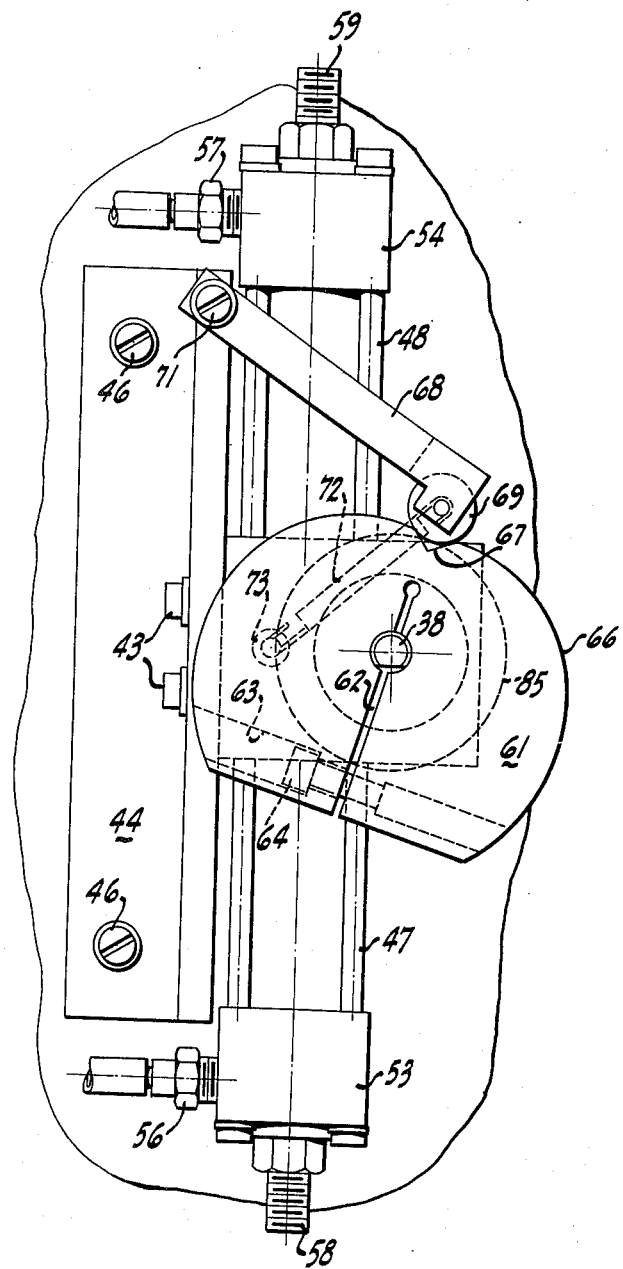
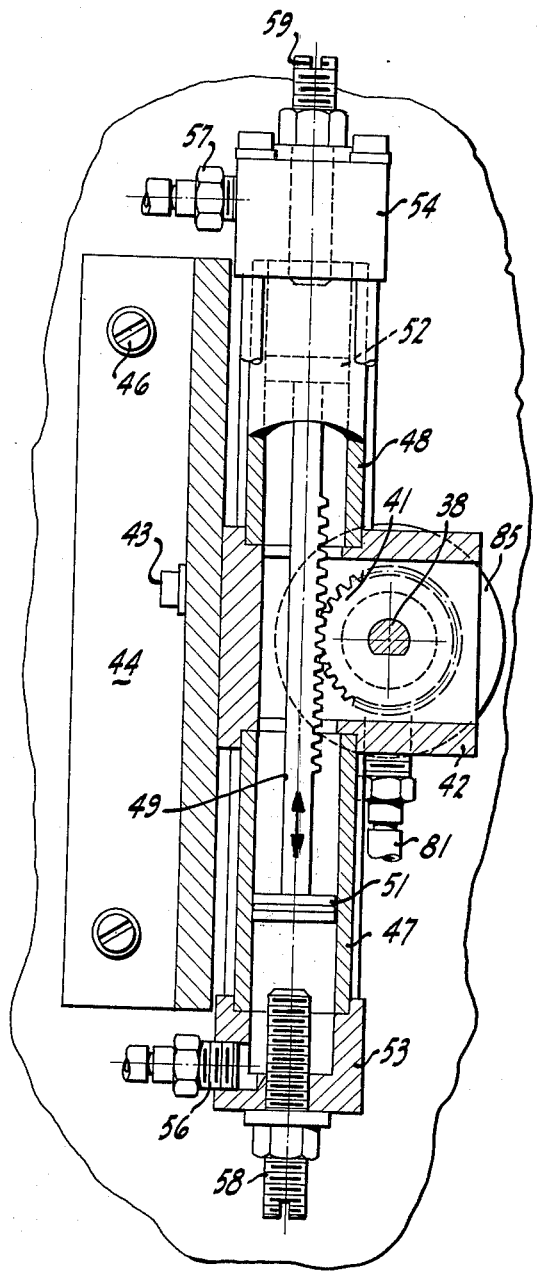
FIG. 7
FIG. 6

FLUID BEARING APPARATUS AND METHOD UTILIZING SELECTIVE TURNTABLE DIVERTER STRUCTURE

This is a continuation of application Ser. No. 434,018 filed Jan. 17, 1974, now abandoned.

CROSS-REFERENCE TO RELATED PATENTS

The fluid bearing track structure utilized with the present invention, with the exception of that portion thereof which is specifically designed for utility at the turntable structure as described hereinafter, may take the form and construction disclosed in several patents previously filed and granted to applicant's assignee. Similarly, the storage magazine, and magazine indexing means, provided at the buffer station also may take the form and construction disclosed in previously issued patents granted to applicant's assignee.

To that end, such track structure and magazine structure and indexing means at the buffer station preferably take the form illustrated and described in Lasch, Jr. et al. U.S. Pat. No. 3,645,581 dated Feb. 20, 1972 or in Lasch, Jr. U.S. Pat. No. 3,718,371 dated Feb. 27, 1973. Such patents illustrate effective fluid bearing means for transporting articles, such as silicon wafers utilized in the manufacture of semiconductor devices in the electronics industry, from one station to another, in conjunction with effective means for automatically indexing a storage magazine into and from which a plurality of articles may be sequentially and automatically fed and removed in conjunction with handling of such articles passing between predetermined stations.

BACKGROUND OF THE INVENTION

1. Field of the Invention

This invention relates generally to the field of improved apparatus and methods for automatically handling and transporting articles, such as silicon and like wafers used in the production of semiconductor devices in the electronics industry. More particularly, this invention relates to the field of systems for automatically transferring articles between stations, which systems possess the capability to selectively collect quantities of articles at an intermediate or buffer station until the articles are needed at an adjacent station.

More particularly, this invention relates to the field of improved apparatus and methods for selectively transporting articles between two predetermined stations, and in which the articles may be selectively diverted in predetermined numbers to an intermediate buffer station and subsequently transferred in sequence to the second of such stations. Still more particularly, this invention relates to the field of fluid bearing systems for automatically handling and transporting articles, such as silicon wafers used in the manufacture of semiconductor devices, during the sequential treatment and handling of such wafers during manufacture of such devices.

2. Description of the Prior Art

As noted hereinabove, certain features of this invention have been known and patented herebefore by applicant's assignee. Such features relate to the fluid bearing track structure and magazine indexing means disclosed herein and utilized in the present apparatus. However, so far as is known, the combination of structural features and handling steps disclosed herein have been unknown heretofore and, except for the noted patents and others related thereto but no more pertinent than such patents, applicant is unaware of any other prior art which discloses or suggests the novel features of the subject apparatus and method. That is, so far as is known, the automatic handling or transfer of individual articles in sequence from a first station to a second station directly and without interruption, or the selective diversion of such articles in sequence into a buffer station rather than directly to the second station in accordance with the particular teachings of this invention, has not been utilized or known in the article handling art heretofore.

SUMMARY OF THE INVENTION

The present invention relates to an improved apparatus and method for handling and transporting articles, particularly generally flat, fragile articles such as silicon and like wafers commonly utilized in the elctronics industry for the manufacture of semiconductor devices. More particularly, this invention relates to an improved fluid bearing apparatus and method which utilizes fluid bearing track structure for automatically transferring articles being manufactured into electronic devices to or past a buffer station into which such articles may be selectively diverted in accordance with the needs of treating or handling apparatus at an adjacent station.

Still more particularly, this invention relates to an improved selectively actuatable article diverting apparatus and method by means of which articles fed thereto in sequence may be allowed to pass therethrough or to be diverted selectively in predetermined numbers into a storage magazine at an intermediate buffer station for subsequent discharge therefrom and reintroduction into the main line of travel of the apparatus for transport to an adjacent station where subsequent treatment or manufacturing steps are to be effected thereon.

From the foregoing it should be understood that the objects of this invention include: the provision of an improved apparatus and method for automatically handling and transporting articles; the provision of an improved apparatus and method for sequentially and automatically diverting articles from a flow path into a storage magazine for subsequent discharge automatically from such magazine back into such flow path in accordance with manufacturing needs; the provision of an improved article handling apparatus and method incorporating therein selectively actuatable means for diverting articles from a flow path or back into such flow path in accordance with manufacturing needs; and the provision in an improved article handling apparatus and method of improved selectively actuatable turntable structure for effecting selective diversion of articles relative to a buffer storage magazine positioned adjacent a flow path for such articles.

These and other objects of this invention, and various aspects thereof, will become apparent from a study of the following detailed description in which reference is directed to the attached drawings.

DESCRIPTION OF THE DRAWINGS

FIGS. 6 and 7 are horizontal sectional views through a portion of the apparatus taken in the planes of lines 6—6 and 7—7 respectively.

DESCRIPTION OF THE PREFERRED EMBODIMENT

Figure 1:
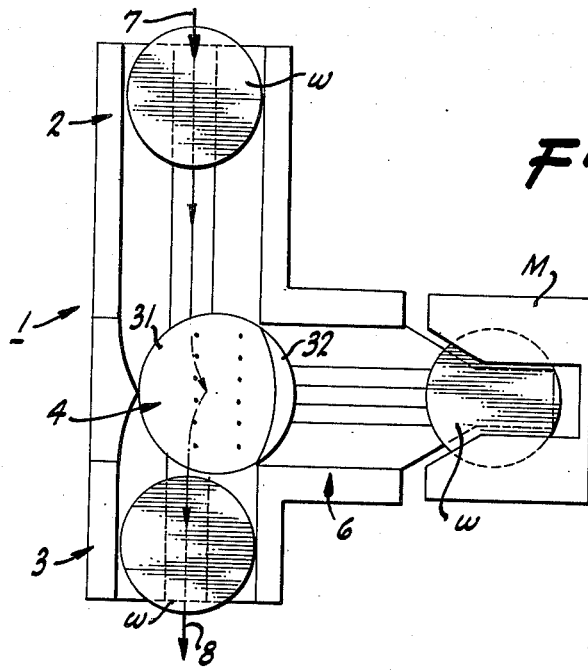
FIG. 1 is a generally schematic view of the subject apparatus illustrating the diverting means oriented to allow articles to pass directly therethrough between two predetermined stations.

In its broader aspects the subject invention relates to a system for automatically, sequentially and non-manually handling a series of articles as the same are transferred between predetermined stations. In its more particular aspects the subject invention relates to an improved apparatus and method for sequentially transferring individual articles from a sending location or station to a receiving location or station in accordance with manufacturing or treating operations to be carried out on such articles during processing thereof.

In conjunction with article transfer between said stations, the subject handling system is provided with selective dirverting means for moving articles in sequence from the main line of travel between the two mentioned stations into a storage or buffer station in which articles may be automatically accumulated in predetermined numbers until needed at the aforementioned receiving station. Upon such need being determined, the diverting means is selectively positioned to effect transfer of the articles from the buffer station back into the main line of travel between the two mentioned stations so that the articles may be carried to the receiving station for further treatment or processing at such station.

In that regard, the present apparatus is specifically designed for handling and transporting fragile flat articles, such as silicon wafers, and like wafers utilized in the electronics industry. However, features hereof which may be utilized in conjunction with the handling and transporting of other articles n the manner noted herein also are contemplated.

While certain aspects of the track structure and magazine indexing means of the subject apparatus have been utilized and known heretofore as described in the aforementioned Lasch, Jr. et al. U.S. Pat. No. 3,645,581 and Lasch, Jr. U.S. Pat. No. 3,718,371, the combination of features disclosed herein, utilizing selective diverting means in conjunction with automatic fluid bearing transfer means, and storage magazine indexing means, has been unknown heretofore to produce the highly desirable and effective results characteristic of this invention.

Referring first to the generally schematic showings of FIGS. 1 through 3, the subject apparatus and method will be described briefly. Such apparatus is designated, in its entirety, by reference numeral 1 and includes four principal components or structures. Reference numeral 2 designates an in-feed fluid bearing track structure for accepting articles, such as silicon wafers designated W, from a first sending station (not shown but generally designated 7) and transferring the same onto another fluid bearing track structure 3 over which the articles are transferred to a second or receiving station (not shown but generally designated 8). During such movement, the articles are supported and moved directionally by a bearing of fluid such as air under pressure in the manner disclosed and described in said Patents.

The third component structure of the apparatus comprises diverter means, generally designated 4, by which wafers W may be selectively transferred into or from the fourth component structure of the apparatus, namely a buffer or storage station, generally designated 6, which is positioned generally intermediate the main path of travel defined by track sections 2 and 3.

Figure 3:
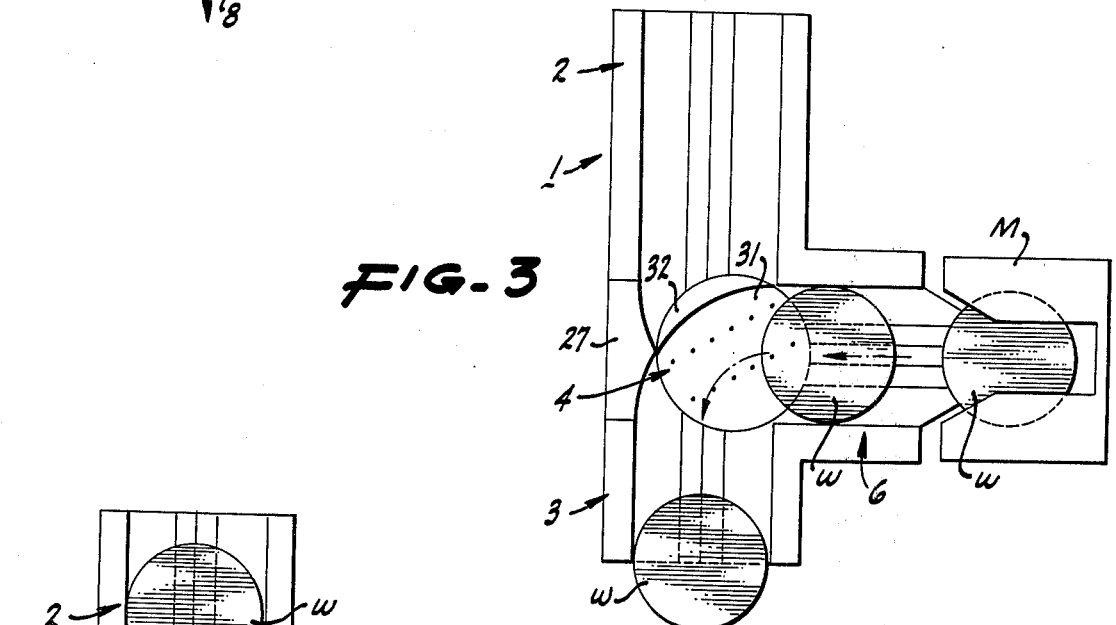
FIG. 3 is a view corresponding generally to FIGS. 1 and 2 but showing the diverting means oriented to divert articles in sequence from a buffer or storage station back into a main flow path.
Figure 2:
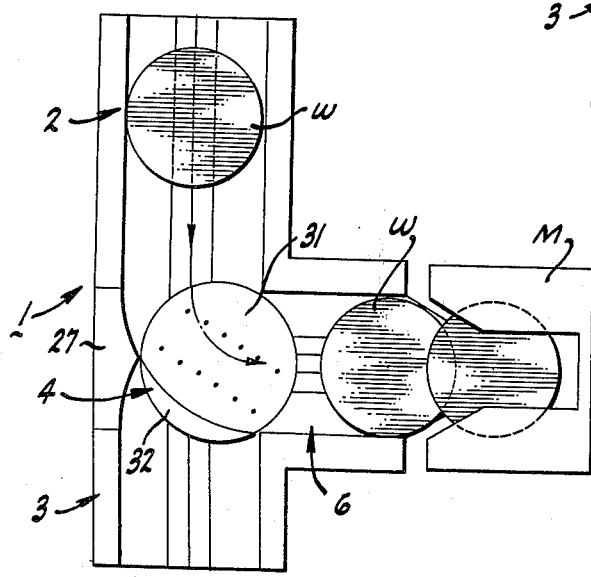
FIG. 2 is a view corresponding generally to FIG. 1 but illustrating the diverting means oriented to divert articles from a main flow path into a buffer or storage station.

As noted from FIGS. 1 through 3, wafers to be transported between the two predetermined stations may be allowed to pass generally straight through the apparatus or may be selectively diverted into or from the buffer storage station 6 as manufacturing needs dictate. In that regard, referring first to FIG. 1 the diverter means 4 is illustrated therein oriented in a position which permits the wafers to by-pass the storage station 6 and to flow directly through the apparatus in essentially a straight line path as designated by the arrows shown therein.

In FIG. 2, however, the diverter means is rotated to an infeed position in which the same is oriented to divert any wafers passing over track section 2 into the storage station 6 in which a predetermined plurality of wafers may be accumulated as conditions dictate.

FIG. 3 shows the diverter means rotated to an out-feed position in which wafers may travel outwardly from the buffer storage station back into the main line of travel for the wafers in accordance with predetermined needs at the receiving station 8 mentioned previously.

Thus, by selectively orienting the diverter means, wafers may be allowed to pass directly through the subject apparatus or to be selectively diverted into or from a buffer storage station as conditions and processing needs dictate.

As will be described hereinafter, all movement of the wafers through the apparatus and into and from the buffer storage station is effected on a fluid bearing which requires no manual handling of the wafers.

Details of the fluid bearing construction and the track structure sections described hereinafter will not be set out in detail herein but reference is directed to said aforementioned Lasch, Jr. et al. and Lasch, Jr. Patents for illustrations and descriptions of track structures well suited for utilization in conjunction with the subject apparatus and wafer handling system.

Details of construction of the subject apparatus are illustrated in FIGS. 4 through 7. In that regard, all essential details of the subject apparatus are illustrated in the drawings but it should be understood that the apparatus is normally supported on a suitable framework (not shown) so as to interface with associated wafer processing equipment at the sending and receiving stations 7 and 8 of the type normally utilized in the manufacture of semiconductor devices and the like.

Figure 4:
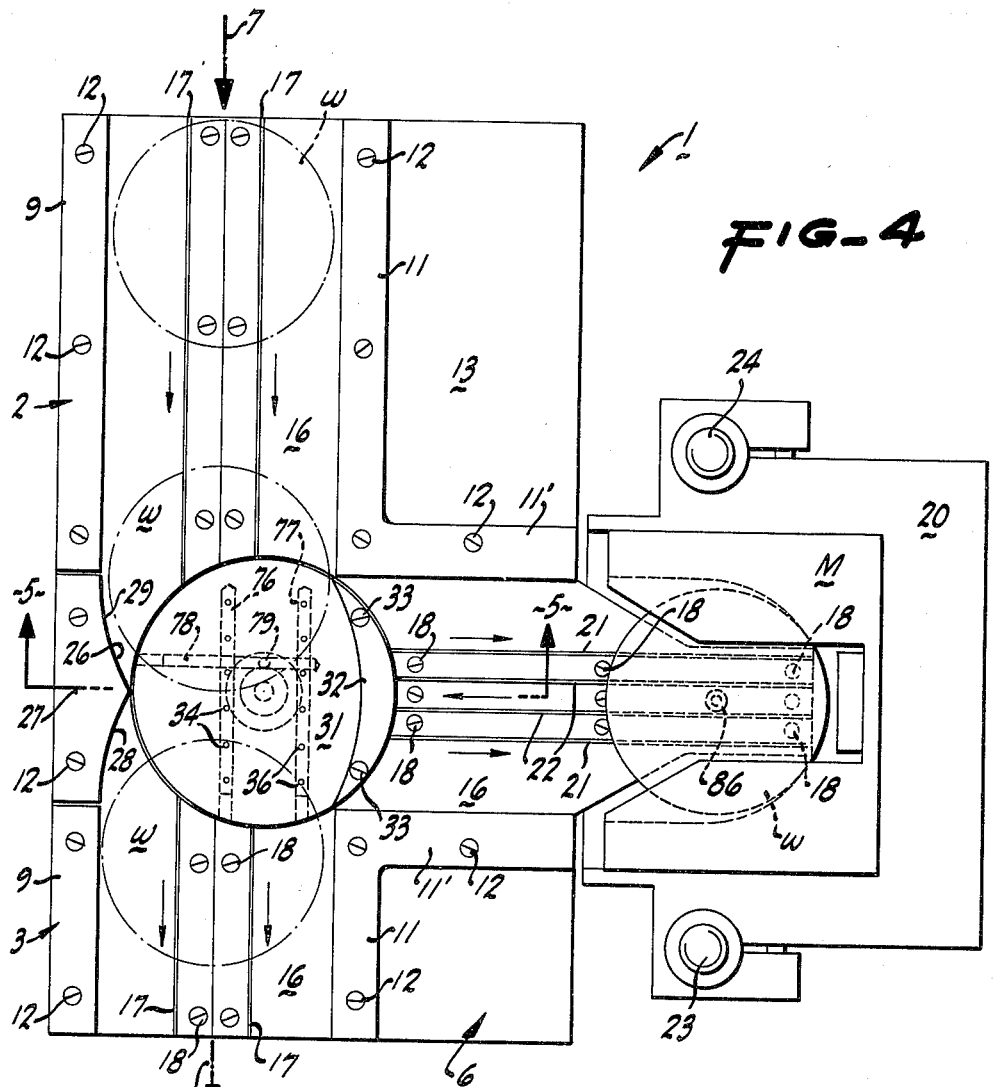
FIG. 4 is a plan view of the subject apparatus.

Referring first to FIG. 4 the aforementioned four principal component structures of the apparatus are illustrated in greater detail. In that regard, the diverting means 4 is shown in FIG. 4 oriented generally in accordance with the schematic showing of FIG. 1 described previously. When thus oriented, the diverting means allows wafers to pass sequentially directly through the apparatus from the sending station 7 interfaced with the apparatus to the receiving station 8 similarly interfaced with the apparatus at which manufacturing, treating or other known processing operations would be performed on wafers fed sequentially from the apparatus to such receiver station.

The track structures 2 and 3 illustrated in FIG. 4 are essentially identical and each defines a fluid bearing section over which wafers are transportable in sequence when positioned to overlie such track sections. Such track sections include directional air bearings which not only support the wafers but move the same at predetermined rates over such sections in accordance with processing needs. In that regard, each track structure 2 and 3 includes opposed guide rails 9 and 11 laterally spaced from each other in accordance with the diametrical dimension of the wafers to be handled in the apparatus. Each such guide rail is held in place by screws or other suitable fasteners 12 on a main supporting plate 13 which forms part of the apparatus supporting framework. It should be noted that each of the guide rails 11 is defined by right angularly oriented sections, one section 11' of which is disposed opposite the similarly positioned section 11' of the other guide rail, with such latter mentioned sections 11' thus defining guide rails of the buffer storage station 6 mentioned previously.

The respective guide rail sections may be formed from any suitable metal but plastic is preferred. Similarly, the base of each track section 2 and 3, generally designated 16, as well as the base of the buffer storage section 6, also designated 16, may be formed from any suitable metal although plastic also may be utilized in that regard.

Each track structure 2 and 3 in the illustrated embodiment includes two jet insert strips of the type illustrated and utilized in Lasch, Jr. U.S. Pat. No. 3,718,371. Such strips define directional air passages through which supporting fluid may emanate against the under surface of wafers positioned on the track sections. The assembly for maintaining the jet strips in their operative position on the track sections is as illustrated in said Lasch, Jr. U.S. Pat. No. 3,718,371 and in that regard, suitable fasteners of the screw type, designated 18, may be utilized to hold the jet strips in place. The fluid passages defined by the jet strips are operatively connected with an air plenum (not shown) lying beneath the track structures 2 and 3 and are directed and oriented to move the wafers in the directions of the arrows shown in FIG. 4 with respect to the track sections.

Thus, it will be understood that a wafer positioned on either of the track sections 2 and 3 will be automatically and non-manually moved in the direction of the arrows shown in FIG. 4 in accordance with the techniques described in said Lasch, Jr. U.S. Pat. No. 3,718,371.

In that same regard, although FIG. 4 illustrates the track structure details shown in U.S. Pat. No. 3,718,371, it should be understood that a track structure also may be utilized as disclosed and described in Lasch, Jr. et al. U.S. Pat. No. 3,645,581.

With respect to buffer storage section 6, the track section thereof similarly preferably is defined by a plurality of jet insert strips of the type disclosed in Lasch, Jr. U.S. Pat. No. 3,718,371. However, to impart bidirectional capability to such track section, two pairs of such strips are utilized in the illustrated embodiment, with the outer pair 21 thereof being oriented to move wafers positioned thereon from the main path of travel defined by the main track sections 2 and 3 laterally inwardly to a wafer storage magazine designated M. The inner pair of jet strips 22 are oriented to move wafers laterally outwardly of the storage magazine M toward the main track sections 2 and 3.

In that connection, it will be noted that the respective pairs of jet strips 21 and 22 each extend into the storage magazine M which is of generally U-shaped construction as seen in FIG. 4. Thus, wafers may be inserted by the strips 21 fully into the magazine when moving to the right in FIG. 4 or may be removed automatically from the magazine by the strips 22 without other assistance when it is desired to move the wafers towards the left relative to the magazine in FIG. 4. Such arrangement for moving wafers into and from the magazine is described in Lasch, Jr. et al. U.S. Pat. No. 3,645,581 and reference is directed thereto for an understanding of the relationship between the magazine and the bidirectional infeed and outfeed track structure associated therewith.

The magazine is supported on an indexable table 20 designed to move vertically relative to base 16 of the track section of the buffer storage station 6 so that vertically spaced slots within the magazine (as illustrated in said Lasch, Jr. et al. U.S. Pat. No. 3,645,581) may be positioned in alignment with the upper surface of the base of the track structure associated therewith. Thus, the magazine may be selectively indexed upward or downward to present a wafer to the track structure or to present a vacant slot to the track structure, depending on whether the magazine is being loaded or unloaded. The indexing means used in conjunction therewith preferably is of the type disclosed and described in said Lasch, Jr. et al. U.S. Pat. No. 3,645,581, and reference is directed thereto for details of construction thereof. The supporting table 20 for the magazine M is movable on vertical guideposts 23 and 24 shown in FIG. 4, also in the manner described in said Lasch, Jr. et al. Patent.

The diverter means 4 includes a base plate 26 which is positioned in alignment with the respective bases 16 of the track sections 2 and 3 and 6 in the manner shown in FIG. 4. Adjacent base plate 26 of the diverting means is a guide rail section 27 held in place by screw fasteners 12 in the manner seen in FIG. 4. Such guide rail 27 may be formed of metal but, as with guide rails 9 and 11, preferably a plastic is utilized therefor. The guide rail section 27 is specifically contoured as shown in FIG. 4 to include two converging, generally arcuate edges 28 and 29 which join and meet at a peak located centrally thereof, such peak generally being aligned with the axis of the buffer storage section 6.

The diverter means is completed by a rotatable generally circular turntable structure 31 and operating mechanism therefor as will be described hereinafter. The turntable 31 includes an arcuate crescent shaped diverting gate section 32 secured to the upper surface thereof by suitable screw fasteners 33. As will be described hereinafter, the turntable is provided with two parallel rows 34 and 36 of air passages which extend laterally thereacross for essentially the full distance thereof.

Referring to FIGS. 1 through 3, it will be noted that the orientation of the turntable 31 and the gate 32 carried thereon will determine the direction of movement of wafers between the track structures 2 and 3 relative to the buffer storage station 6. In that regard, as best seen in FIGS. 2 and 3, the arcuate edges of the guide section 27 are contoured to conform generally with the generally arcuate interior edge of the crescent shaped gate 32 carried by the turntable so that a smooth transitional guide wall is defined between the guide section 27 and the gate 32 to permit wafers to traverse the turntable in any of its three positions of orientation shown in FIGS. 1 through 3.

Figure 5:
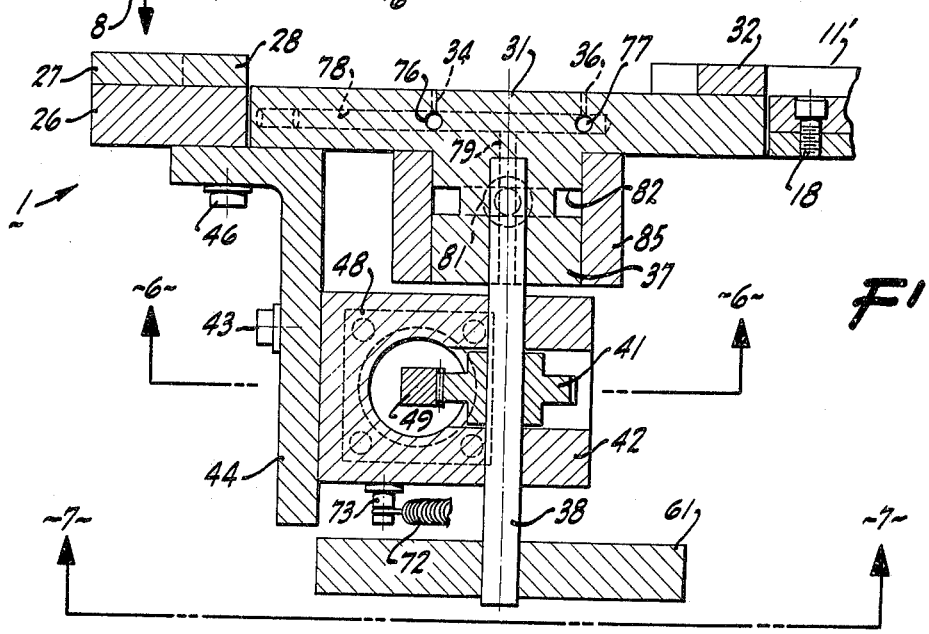
FIG. 5 is a vertical sectional view through a portion of the subject apparatus taken in the plane of line 5—5 of FIG. 4.

The mechanism for effecting selective rotation of the turntable 31 is shown in FIGS. 5 through 7. In that connection, it will be noted that the turntable includes a depending boss portion 37 within which is secured a mounting shaft 38. Therefore, upon rotation of shaft 38 in either the clockwise or counterclockwise direction, the turntable will be similarly rotated. It should be understood that shaft 38 and boss 37 are keyed together in known fashion.

To effect such selective rotation the shaft 38 is keyed to a pinion gear 41 positioned within a gear housing 42, such housing being secured by suitable bolt fasteners 43 to a mounting bracket 44 similarly secured by fasteners 46 to the underside of the base plate 26.

As seen in FIG. 6, the housing 42 has a pair of cylinders 47 and 48 welded or otherwise secured in engagement therewith to extend laterally in opposite aligned directions therefrom. A rack gear 49 having the teeth thereof meshed with pinion 41 is positioned to extend laterally from the housing into the cylinders 47 and 48. At its opposite end the rack gear is provided with pistons 51 and 52, respectively.

Upon movement of the rack gear in either of the opposite directions illustrated by the arrow in FIG. 6, the pinion will be rotated in a clockwise or counterclockwise direction which in turn will rotate shaft 38 keyed to the pinion to produce attendant rotation of the turntable 31.

Movement of the rack gear 49 is selectively effected by pressure means of the hydraulic or pneumatic type, with the pneumatic type being utilized in the illustrated embodiment. In that regard, air pressure fittings 53 and 54 are operatively connected with the cylinders 47 and 48 in any suitable fashion, such as by welding the same thereto. Pneumatic connectors 56 and 57 respectively operatively join the respective cylinders and the pistons located therein with a source of pneumatic fluid under pressure in known fashion. Thus, it will be understood, referring to FIG. 6, the introduction of air under pressure through fitting 56 into cylinder 47 will move piston 51 and rack gear 49 in one direction whereas introduction of air under pressure through fitting 57 into engagement with piston 52 will move rack gear 49 in the opposite direction. Thus, by selectively exhausting one of the cylinders while air under pressure is introduced into the opposite cylinder, selective movement, within predetermined limits, of the rack gear may be readily and rapidly effected with attendant selective and rapid rotational movement of the turntable 31.

Means to limit the extent of travel of the rack gear is provided in conjunction with the cylinders 47 and 48. In that connection, set screws 58 and 59 are threadedly received through an end of the respective pressure fittings 53 and 54. By properly positioning the set screws 58 and 59 to locate their respective inner ends within the pistons 47 and 48, respectively, such ends will positively limit travel of the rack gear 49 when the pistons 51 and 52 contact the respective set screws. Thus, travel of the rack gear between two predetermined maximum positions may be effected simply by introducing air into one of the cylinders while the opposite cylinder is exhausted to force the rack gear in the predetermined direction desired until a piston strikes the end of an associated set screw. Such maximum travel positions define two of the selective positions for the turntable 31, namely the respective wafer diverting positions shown in FIGS. 2 and 3.

When the turntable is positioned in the non-diverting or by-pass position shown in FIG. 1, the rack gear is oriented in the central location shown in FIG. 6. A mechanism is provided in conjunction with the shaft 38 to positively and automatically orient the rack gear 49 in the central position when air under pressure is absent from both cylinders 47 and 48. In that regard, a centering cam plate 61 is secured on the lower end of shaft 38 as seen in FIGS. 5 and 7. Such cam plate is provided with a central diametrically extending slot 62 which permits the plate, when the slot is expanded, to be positioned around the shaft 38 and to be subsequently clamped thereon in the manner seen in FIG. 7. The cam plate is provided with a transverse bore 63 one end of which is threaded to receive therein a retaining clamp screw 64 by means of which the slot 62 may be held closed to hold the cam plate 61 in clamping engagement with the shaft 38.

The cam plate 61 is provided for the majority of its extent with an eccentric cam surface 66 which is provided centrally thereof with a V-shaped notch 67. A cam follower arm 68 having a roller 69 pivotally connected with its outer end is positioned to engage the cam surface 66. The inner end of the cam follower arm is pivotally mounted by a suitable fastener 71 with the mounting bracket 44 mentioned previously. Depending upon the position of the cam plate the follower arm 68 will pivot about the axis of fastener 71 in known fashion.

Preferably a tension spring 72 is engaged with the outer end of the follower arm and is interposed therebetween and a mounting pin 73 secured to the underside of housing 42 for the purpose of holding the cam roller 69 in engagement with the camming surface 66 of plate 61 in all operating positions.

When the cam plate 61 is moved clockwise or counterclockwise when viewed in FIG. 7 in response to movement of the rack gear 49, cam follower arm 68 is forced out of the centering notch 67 by the eccentric profile of the camming surface adjacent such notch in both sides thereof. Such movement increases the load built up in the tension spring in proportion to the extent of movement of the cam plate. When the air is applied to the pistons secured to the rack gear is exhausted from the associated cylinders, the tension spring 72 urges the cam follower arm in the clockwise direction in FIG. 7 towards the neutral or central position shown in FIG. 7. Such movement of the follower arm automatically effects rotation of the cam plate back to the center position shown in such Figure. Similarly, the tension spring maintains the cam plate, and therefore the turntable, in the non-diverting position seen in FIGS. 1 and 4 until and unless air is introduced against one of the pistons 51 or 52 to effect movement of the rack gear 49 as described previously.

Thus, it will be seen that a simple yet highly effective mechanism for selectively rotating the turntable 31 and gate 32 carried thereon between the three predetermined positions illustrated in FIGS. 1 through 3 has been provided. In that regard, by properly locating cam plate 61 on shaft 38 in the manner described, gate 32 may be precisely positioned in the position shown in FIGS. 1 and 4 so that wafers passing relative to the turntable may move directly thereover without appreciable bumping to preclude damage thereto.

By properly locating the inner ends of set screws 58 and 59, the travel of rack gear 49 may be precisely limited so that selective positioning of the turntable gate 32 in either of the positions shown in FIGS. 2 and 3 may be readily and accurately effected.

It will be noted from viewing FIGS. 1 through 3 that the turntable is thus actuatable and positionable between three positions, each of which is 120° removed from its associated other positions.

As noted previously, the turntable is provided with two parallel rows 34 and 36 of air passages which emanate from the upper surface thereof as seen in FIG. 5. Such air passages are connected with two conduits 76 and 77 formed to extend inwardly from an edge of the turntable as seen in FIG. 4. Such conduits are plugged at the outer end thereof. Extending transversely of and communicating with the conduits 76 and 77 as seen in FIGS. 4 and 5 is another conduit 78 which similarly extends inwardly from an edge of the turntable and is similarly plugged at its outer end. Extending downwardly through the boss 37 of the turntable is another conduit 79 which communicates with the aforementioned conduit 78. Such conduit 79 is plugged adjacent its lower end and is operatively connected intermediate its ends with a pneumatic fitting 81 (note FIG. 6) by means of which air under pressure may be introduced into the aforementioned conduits 76 and 77 to exit from the air passages 34 and 36 in the upper surface of the turntable. A bearing collar 85 surrounds boss 37 of the turntable and is held from rotation by the pneumatic fitting 81 and its associated connecting hose (see FIG. 5) beneath the aforementioned base plate 26. An annular groove 82 is formed in the periphery of boss 37 in communication with the vertically oriented conduit 79 so that the conduit is operatively connected in all positions of the turntable with the air source 81 irrespective of the orientation of the turntable. As seen in FIG. 6, fitting 81 communicates with groove 82 to introduce air under pressure thereinto.

In that regard, it will be noted that the air passages 34 and 36 extending upwardly through the turntable are not directionally oriented in that movement of the wafer across the turntable irrespective of the turntable's orientation need not be assisted. That is, wafers introduced onto the turntable by either track structure 2 or the track section of the buffer storage station 6 imparts enough directional movement to such wafer so that the same travels across the turntable without assistance. The purpose of the air passages through the turntable is merely to provide a cushion to support the wafer above the surface of the turntable during such movement.

Selective indexing of the magazine M with its supporting plate 20 is effected in response to signals transmitted from a sensing device generally designated 86 in FIG. 4. Such sensing device preferably is of known pneumatic type to be compatible with the other pneumatic structures of the subject apparatus. However, a light sensing device of the type utilized and described in the apparatus of Lasch, Jr. et al. U.S. Pat. No. 3,645,581 also may be utilized if preferred. In either event, the type of sensor utilized is commercially available and, apart from its inclusion in the subject apparatus forms no part of the subject invention.

Such sensor 86 need only possess the capability of transmitting a control signal in response to determining that a wafer is present directly thereabove. In that connection, when a wafer is introduced into a vacant slot of the magazine when the turntable is in the position shown in FIG. 2, the presence of such wafer is sensed by the pneumatic sensor which, after a short time delay to allow the wafer edges to settle in place in contact with the magazine slot, causes the index mechanism controlling the magazine supporting plate 20 to elevate one slot so that an open slot is presented to the adjacent track structure to adapt the magazine to receive a subsequent wafer. Such sensing and indexing sequences are repeated as often as necessary within the size capability of the magazine.

When the turntable is in the position shown in FIG. 3, so that the wafers may be fed from the storage magazine, any wafer positioned in alignment with the upper surface of the track within the magazine will automatically be withdrawn therefrom by the directional effect of air passing through the jet strips 22 as described previously. The sensor 86 then determines the absence of a wafer and transmits a signal which causes the magazine to move downward one or more slots until another wafer is brought within the sphere of influence of the sensor, at which time the magazine is stopped, so that such subsequent wafer may be withdrawn from the magazine. The procedure of wafer sensing and indexing of the magazine in the downward direction is repeated until the wafer magazine is empty, or until no further wafers are to be withdrawn from the magazine in accordance with the needs at adjacent receiving station 8.

The subject apparatus is provided with a suitable operator regulated control panel, including control buttons to regulate the various operations described hereinabove. An on-off power source button is provided to actuate the apparatus. Index and reset buttons are provided to control the maximum up and down positions of the magazine when it is desired to remove a full magazine or insert an empty magazine into position therein. Send and receive buttons are provided to selectively move the turntable from the non-diverting position of FIG. 1 to the infeed or outfeed positions respectively of FIGS. 2 and 3. Finally, a bypass button is provided to return the turntable to the central position shown in FIG. 1 when desired. While manual control buttons are shown in conjunction with the subject apparatus, it should be understood that automated control, utilizing computer control procedures, also may be employed if desired.

In either instance, it should be understood that upon the main on-off power switch being actuated and with an empty magazine positioned at the buffer storage station, actuation of the receive button will cause rotation of the turntable in response to air being directed against piston 52 carried by rack gear 49 until the opposite piston 51 strikes the end of limit set screw 58 as described. When the desired number of wafers have been inserted into the magazine and it is subsequently desired to remove the same, or to effect bypass while such wafers are retained in the magazine, the bypass or send button is actuated so that wafers may be automatically fed from the magazine in response to rotation of the turntable to the desired position.

Figure 8:
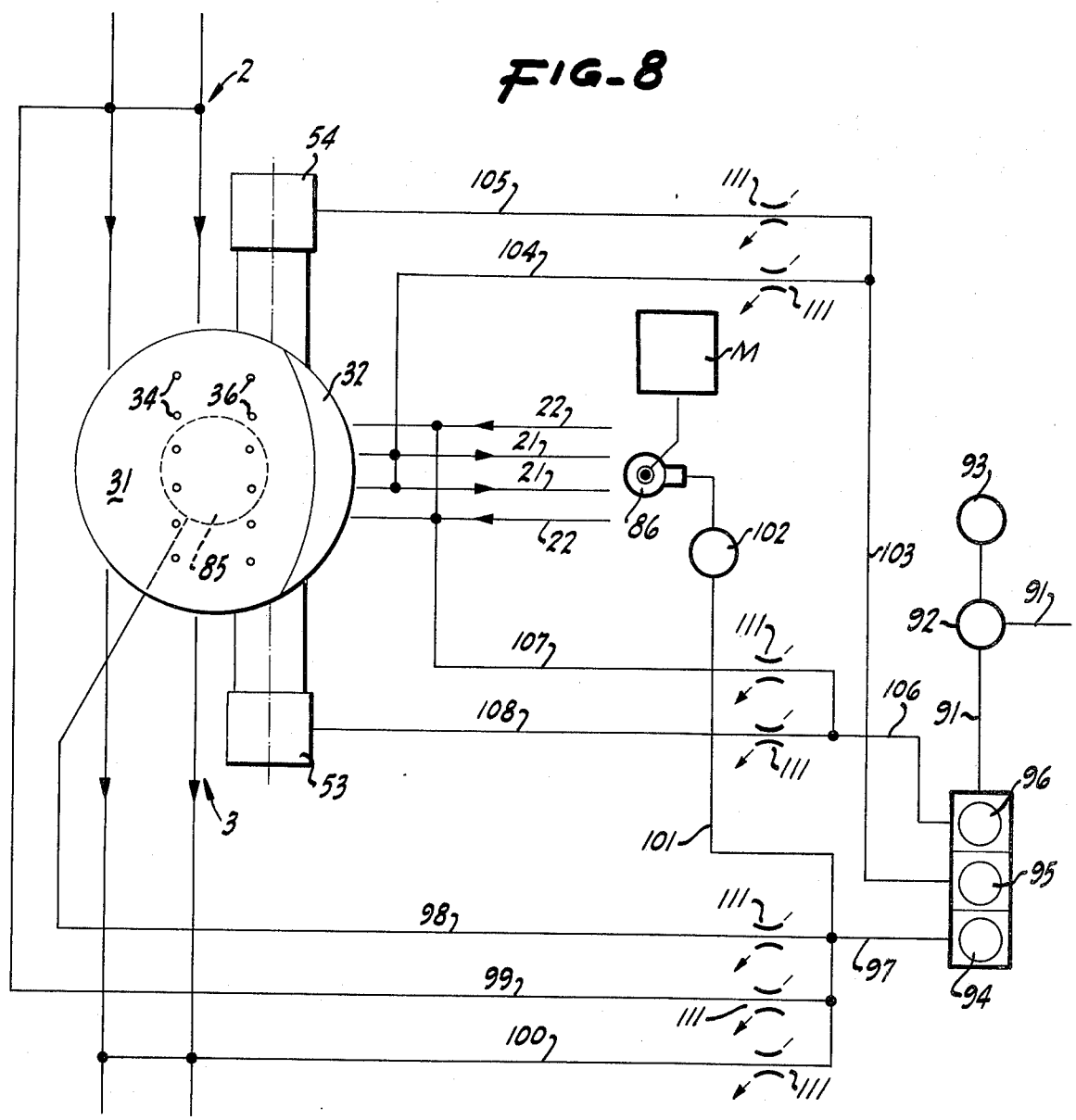
FIG. 8 is a diagrammatic view of the pneumatic system utilized in conjunction with the preferred embodiment of the subject article handling and transporting system.
Figure 9:
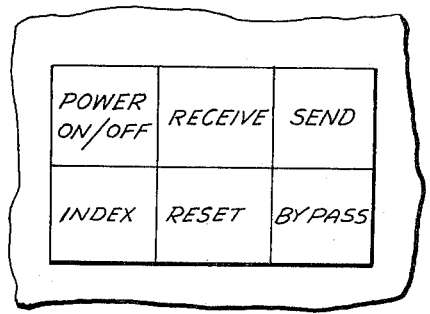
FIG. 9 is a plan view of a control panel for the subject apparatus.

Reference is now directed to FIG. 8 for a schematic showing of the pneumatic system utilized in conjunction with the subject apparatus. Air for the system is introducible through a main conduit 91 through a pressure regulator 92 carrying a suitable pressure gauge 93 in conjunction therewith for visual determination of operating conditions.

The main inlet conduit operatively communicates with three solenoid valves 94, 95 and 96 respectively. Valve 94 is operated by and actuated in conjunction with the main on-off switch and operatively connects the air source, through a conduit 97 and branch conduits 98, 99 and 100, with the turntable air passages 34 and 36, the infeed track section 2 and the outfeed track section 3, respectively. Additionally, valve 94 is connected through another branch conduit with the pneumatic sensor 86 which regulates the position of the supply magazine M as described previously. Preferably a pressure regulator 102 is interposed between valve 94 and sensor 86. Thus, it will be seen that upon the apparatus being turned on, air passes through conduits 98, 99, 100 and 101 at all times.

A second solenoid valve 95 is operatively connected (through a conduit 103 and branch conduit 104) with the infeed jet strips 21 of the buffer station mentioned previously and (through branch conduit 105) with the pneumatic pressure fitting 54 which controls piston 52 on the rack gear 49. Such solenoid valve 95 is controlled by the receive switch of the control panel to effect rotation of the turntable 31 to the orientation shown in FIG. 2 in which position air is introduced through the jet strips 21 to introduce wafers into the supply magazine M. Operation of valve 95 does not deactivate valve 94.

A third solenoid valve 96 is operatively connected (through conduit 106 and branch conduit 107) with the outfeed jet strips 22 of the buffer station and also (through branch conduit 108) with the opposite pressure fitting 53 which controls piston 51 on the opposite end of rack gear 49. Valve 96 operates in accordance with signals from the send switch of the control panel to effect rotation of the turntable to the orientation seen in FIG. 3. Valve 96 does not deactivate valve 94.

As also seen in FIG. 8, all of the conduits preferably are provided with an adjustable flow control valve 111 which permits regulation of air pressure in the conduits to control wafer travel velocity and the speed of rotation of the turntable as required by the nature and type of the articles being handled in the subject apparatus.

From the foregoing, it should be understood that this invention involves an apparatus and method for selectively diverting wafers or like articles into or from a buffer storage magazine or for bypassing such magazine in accordance with manufacturing or other production needs or handling requirements.

Having thus made a full disclosure of this invention, attention is directed to the appended claims for the scope of protection to be afforded hereto.

I claim:

1. Fluid bearing apparatus for handling articles comprising
    A. a first fluid bearing track structure over which articles enter said apparatus from a first station,
    B. a second fluid bearing track structure over which articles pass from said apparatus to a second station,
    C. a third fluid bearing track structure angularly oriented relative to said first and second fluid bearing track structures,
    D. a selectively indexable article storage magazine at one end of said third track structure, and
    E. article diverter means interposed between said three fluid bearing track structures for selectively diverting articles from said first track structure onto said third track structure and into said magazine, comprising
        1. a selectively rotatable fluid bearing turntable structure for receiving articles from said first track structure and either passing said articles on a fluid cushion onto said second track structure or diverting the same on a fluid cushion onto said third track structure,
            a. said turntable structure including a crescent shaped diverting gate thereon with which said articles come in contact when positioned on said turntable to direct such articles in one of two directions, and
        2. mechanism including means for selectively rotating said turntable between positions in which said articles are diverted thereby onto said third track structure or bypass the same.

2. The apparatus of claim 1 in which said turntable rotating mechanism includes means for selectively rotating said turntable to a third position in which articles on said third track structure may be diverted on a fluid bearing onto said second track structure for transfer to said second station.

3. The apparatus of claim 1 in which said third track structure is bidirectional so that articles may pass thereover on a fluid bearing in both directions relative to said magazine.

4. The apparatus of claim 1 in which said turntable rotating mechanism comprises a pneumatically actuated rack and pinion assembly operatively connected with said turntable.

5. The apparatus of claim 1 which further includes
    F. a sensor adjacent said magazine for transmitting control signals to effect indexing of said magazine selectively upwardly or downwardly in accordance with the entry of articles into or discharge of articles from said magazine.

6. The apparatus of claim 1 which further includes
    F. a guide rail adjacent said turntable to be contacted by said articles as the same pass across said turntable, said guide rail including
        1. two generally arcuate edges facing said turntable,
        2. each of said edges conforming generally to the curvature of said crescent shaped diverting gate to form a continuation thereof when said turntable is in either of two article diverting positions.

7. In a fluid bearing apparatus for handling articles passing between first and second stations on first and second article transmitting track structures,
    A. a third track structure angularly oriented relative to said first and second track structures,
        1. said third track structure comprising a fluid bearing for transporting articles thereover on a fluid cushion,
    B. a selectively indexable article storage magazine at one end of said third track structure, and,
    C. article diverter means interposed between said three track structures for selectively diverting articles on a fluid cushion from said first track structure onto said third track structure and into said magazine, comprising
1. a selectively rotatable fluid bearing turntable structure for receiving articles from said first track structure and either passing said articles on a fluid cushion onto said second track structure or diverting the same on a fluid cushion onto said third track structure,
   a. said turntable structure including a crescent shaped diverting gate thereon with which said articles come in contact when positioned on said turntable to direct such articles in one of two directions, and
2. mechanism including means for selectively rotating said turntable between positions in which said articles are diverted thereby onto said third track structure or bypass the same.

8. The apparatus of claim 7 in which said turntable rotating mechanism includes means for selectively rotating said turntable to a third position in which articles on said third track structure may be diverted on a fluid cushion onto said second track structure for transfer to said second station.

9. The apparatus of claim 7 in which each of said first and second track structures also constitutes a fluid bearing for effective movement of said articles thereacross on a fluid cushion.

10. The apparatus of claim 7 in which said third track structure is bidirectional so that articles may pass thereover on a fluid cushion in both directions relative to said magazine.

11. The apparatus of claim 7 in which said turntable rotating mechanism comprise a pneumatically actuated rack and pinion assembly operatively connected with said turntable.

12. The apparatus of claim 7 which further includes
D. a sensor adjacent said magazine for transmitting control signals to effect indexing of said magazine selectively upwardly or downwardly in accordance with the entry of articles into or discharge of articles from said magazine.

13. The apparatus of claim 7 which further includes
D. a guide rail adjacent said turntable to be contacted by said articles as the same pass across said turntable, said guide rail including
   1. two generally arcuate edges facing said turntable,
   2. each of said edges conforming generally to the curvature of said crescent shaped diverting gate to form a continuation thereof when said turntable is in either of two article diverting positions.

14. A method of selectively and automatically handling articles on a fluid bearing without manual handling during manufacturing procedures comprising
A. feeding articles on a fluid cushion from a first station toward a second station,
B. determining the need for said articles at said second station,
C. causing said articles to pass on a fluid cushion onto and over a selectively positionable fluid bearing turntable having a crescent shaped diverting gate thereon with which said articles come in contact during their movement toward said second station,
D. positioning said crescent shaped diverting gate of said turntable in the path of travel of said articles to divert said articles in sequence from their path of travel toward said second station, and
E. collecting said diverted articles at a third station until such articles are required at said second station.

15. The method of claim 14 which includes
F. subsequently discharging and moving said diverted and collected articles on a fluid cushion from said third station in accordance with requirements at said second station, and
G. positioning said crescent shaped diverting gate of said turntable to divert said discharged articles on a fluid cushion back onto their path of travel on a fluid cushion toward said second station.

16. The method of claim 15 which includes moving said articles over the same fluid cushion during movement thereof into and away from said third station.

17. Apparatus for handling articles comprising
A. a first track structure over which articles enter said apparatus from a first station,
B. a second track structure over which articles pass from said apparatus to a second station,
C. a third track structure angularly oriented relative to said first and second track structures,
D. a selectively indexable article storage magazine at one end of said third track structure, and
E. article diverter means interposed between said three track structures for selectively diverting articles from said first track structure onto said third track structure into said magazine, comprising
   1. a selectively rotatable turntable structure for receiving articles from said first track structure and either passing said articles onto said track structure or diverting the same onto said third track structure,
      a. said turntable structure including a crescent shaped diverting gate thereon with which said articles come in contact when positioned on said turntable to direct such articles in one of two directions, and
   2. mechanism including means for selectively rotating said turntable structure between positions in which said articles are diverted thereby onto said third track structure or bypasses the same.

18. The apparatus of claim 17 which further includes
F. a guide rail adjacent said turntable structure to be contacted by said articles as the same pass across said turntable, said guide rail including
   1. two generally arcuate edges facing said turntable,
   2. each of said edges conforming generally to the curvature of said crescent shaped diverting gate to form a continuation thereof when said turntable is in either of two article diverting positions.

19. In an apparatus for handling articles passing between first and second stations on first and second article transmitting track structures,
A. a third track structure angularly oriented relative to said first and second track structures,
B. a selectively indexable article storage magazine at one end of said third track structure, and
C. article diverter means interposed between said three track structures for selectively diverting articles from said first track structure onto said third track structure into said magazine, comprising
   1. a selectively rotatable turntable structure for receiving articles from said first track structure and either passing said articles onto said second track structure or diverting the same onto said third track structure, a. said turntable structure including a crescent shaped diverting gate thereon with which said articles come in contact when positioned on said turntable to direct such articles in one of two directions, and
2. mechanism including means for selectively rotating said turntable structure between positions in which said articles are diverted thereby onto said third track structure or bypasses the same.

20. The apparatus of claim 19 which further includes
D. a guide rail adjacent said turntable structure to be contacted by said articles as the same pass across said turntable, said guide rail including
1. two generally arcuate edges facing said turntable,
2. each of said edges conforming generally to the curvature of said crescent shaped diverting gate to form a continuation thereof when said turntable is in either of two article diverting positions.

21. A method of selectively and automatically handling articles on interfaced fluid bearing track structures without manual handling during manufacturing procedures comprising
A. feeding articles on a fluid bearing track structure from a first station toward a second station,
B. automatically determining the need for said articles at said second station,
C. diverting said articles on a fluid cushion from their path of travel toward said second station in accordance with need therefor at said second station by selectively positioning a fluid bearing turn-table having a crescent shaped diverting gate thereon in said path of travel of said articles to effect such selective diversion of said articles in sequence from said path of travel toward said second station as such articles contact said diverting gate in accordance with said need therefor at said second station,
D. feeding said diverted articles on another fluid bearing track structure toward a third station, and
E. collecting said diverted articles in sequence at said third station until such articles are required at said second station.

22. The method of claim 21 which includes
F. subsequently discharging said diverted and collected articles on said other fluid bearing track structure from said third station in accordance with requirements therefor at said second station, and
G. selectively positioning said turntable to divert said discharged articles on a fluid cushion back onto said path of travel toward said second station.

23. The method of claim 22 which includes moving said articles on a fluid cushion over the same bidirectional fluid bearing track structure during movement thereof toward and away from said third station.

* * * * *